United States Patent
Deng et al.

(10) Patent No.: US 7,821,816 B2
(45) Date of Patent: Oct. 26, 2010

(54) METHOD FOR CONSTRUCTING SHMOO PLOTS FOR SRAMS

(75) Inventors: Xiaowei Deng, Plano, TX (US); Theodore W. Houston, Richardson, TX (US); Wah Kit Loh, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 12/401,181

(22) Filed: Mar. 10, 2009

(65) Prior Publication Data

US 2010/0232242 A1    Sep. 16, 2010

(51) Int. Cl.
*G11C 11/00*    (2006.01)
(52) U.S. Cl. ............. 365/154; 365/189.09; 365/189.14; 365/203
(58) Field of Classification Search ............... 365/154, 365/203, 189.09, 189.14, 189.15
See application file for complete search history.

(56) References Cited

U.S. PATENT DOCUMENTS 7,626,851 B2 * 12/2009 Behrends et al. ............ 365/154

OTHER PUBLICATIONS

Xiaowei Deng et al., Structure and Methods for Measuring Margins in an SRAM bit, U.S. Utility Patent Application, filed Feb. 18, 2009, U.S. Appl. No. 12/388,439.

* cited by examiner

*Primary Examiner*—Anh Phung
*Assistant Examiner*—Hien N Nguyen
(74) *Attorney, Agent, or Firm*—Rose Alyssa Keagy; W. James Brady; Frederick J. Telecky, Jr.

(57)    ABSTRACT

A method of preparing Shmoo plots where both the number of failures and also the failure type is specified at each test voltage measurement point. A method that uses the operational SRAM array circuitry to determine the type of failure that may have occurred at each test voltage measurement point.

13 Claims, 7 Drawing Sheets

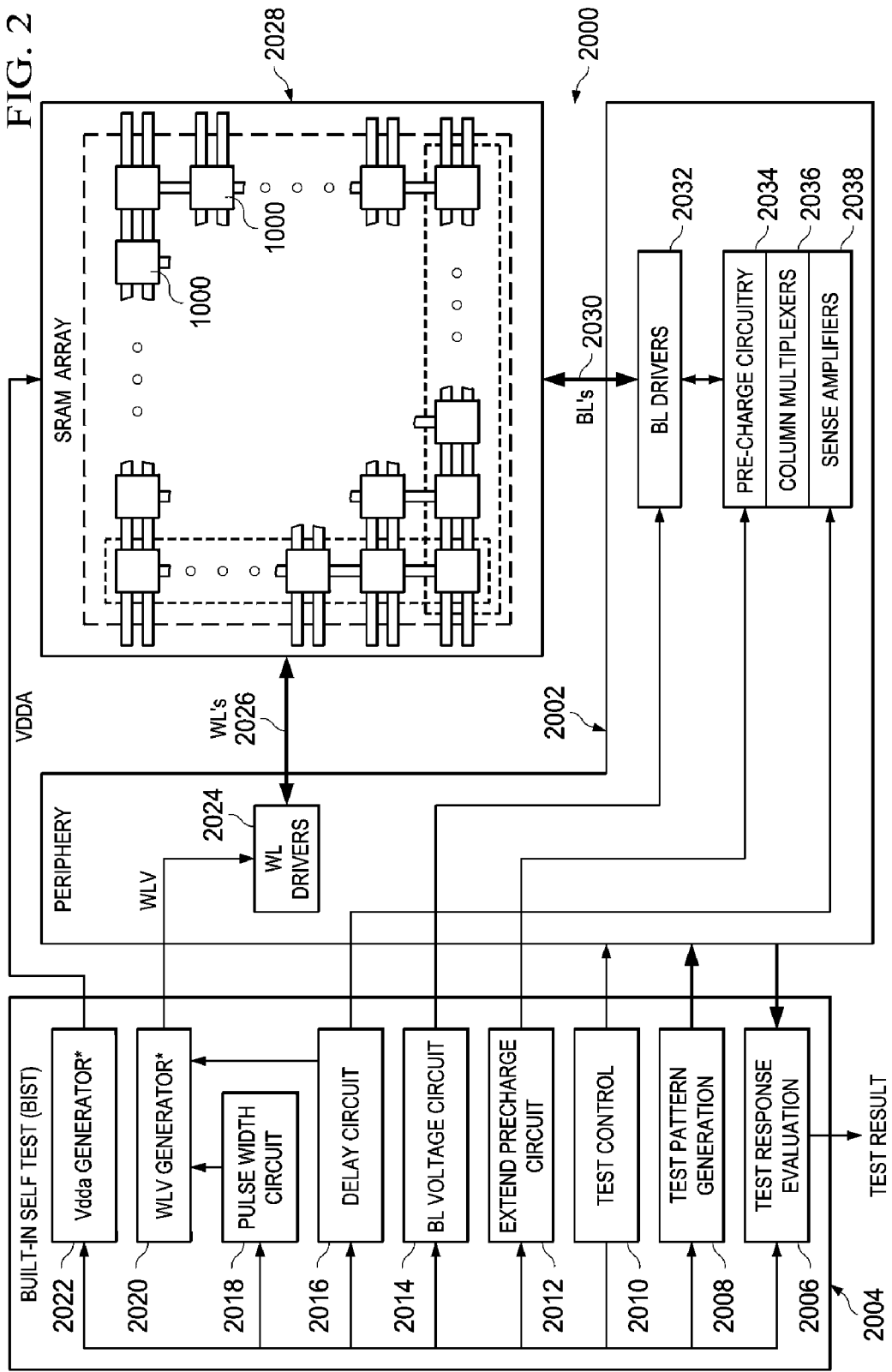

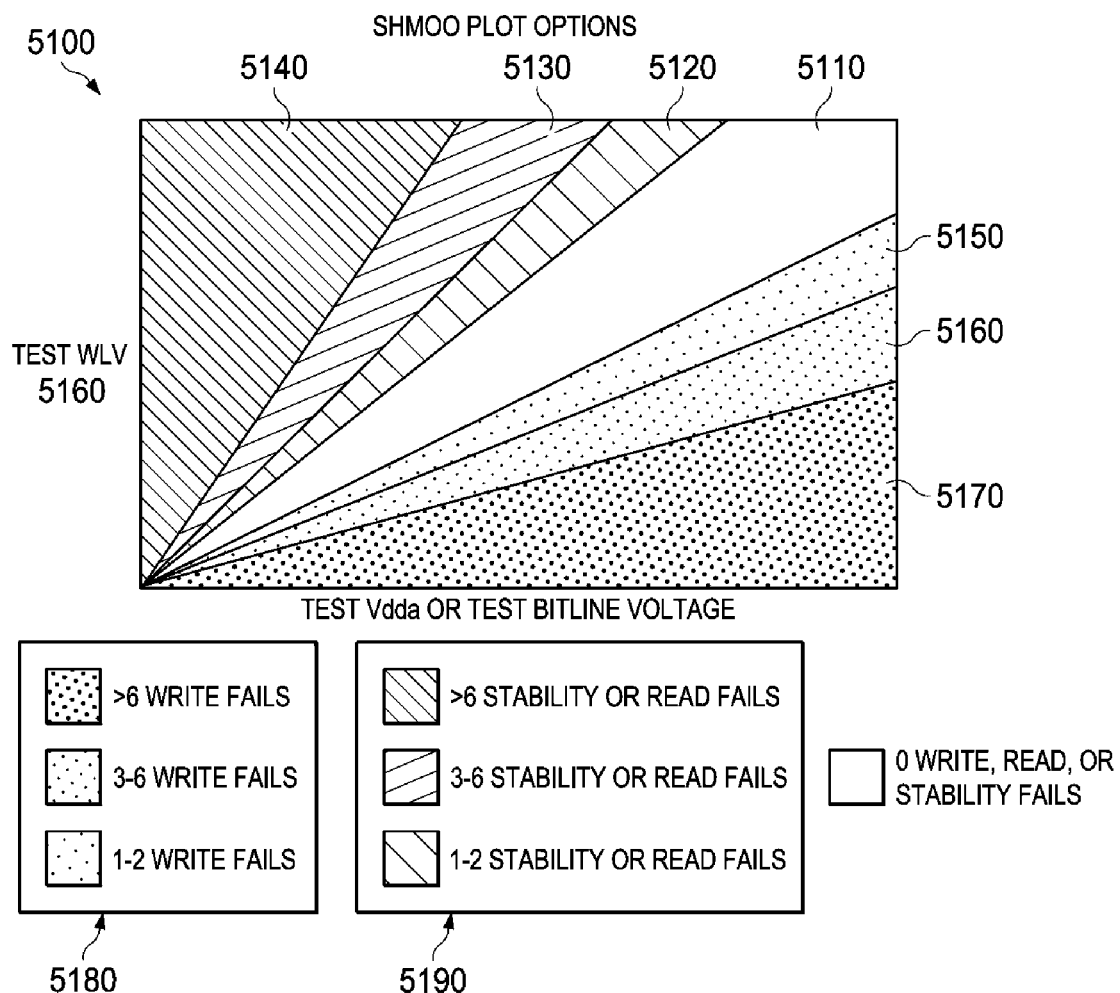

METHOD FOR CONSTRUCTING SHMOO PLOTS FOR SRAMS

CROSS-REFERENCE TO RELATED APPLICATIONS

The following co-pending patent application is related and hereby incorporated by reference: U.S. patent application Ser. No. 12/388,439 (Texas Instruments docket number TI-66971, filed Feb. 18, 2009. With its mention in this section, this patent application is not admitted to be prior art with respect to the present invention

FIELD OF THE INVENTION

This invention relates to the field of integrated circuits. More particularly, this invention relates to testing of static random access memories (SRAMs) in integrated circuits.

DESCRIPTION OF THE VIEWS OF THE DRAWING

FIG. 2 is a circuit diagram of an SRAM array.

FIGS. 5A and 5B are examples of 2D Shmoo Plots with one failure mode and multiple failure modes respectively.

DETAILED DESCRIPTION

Figure 1:
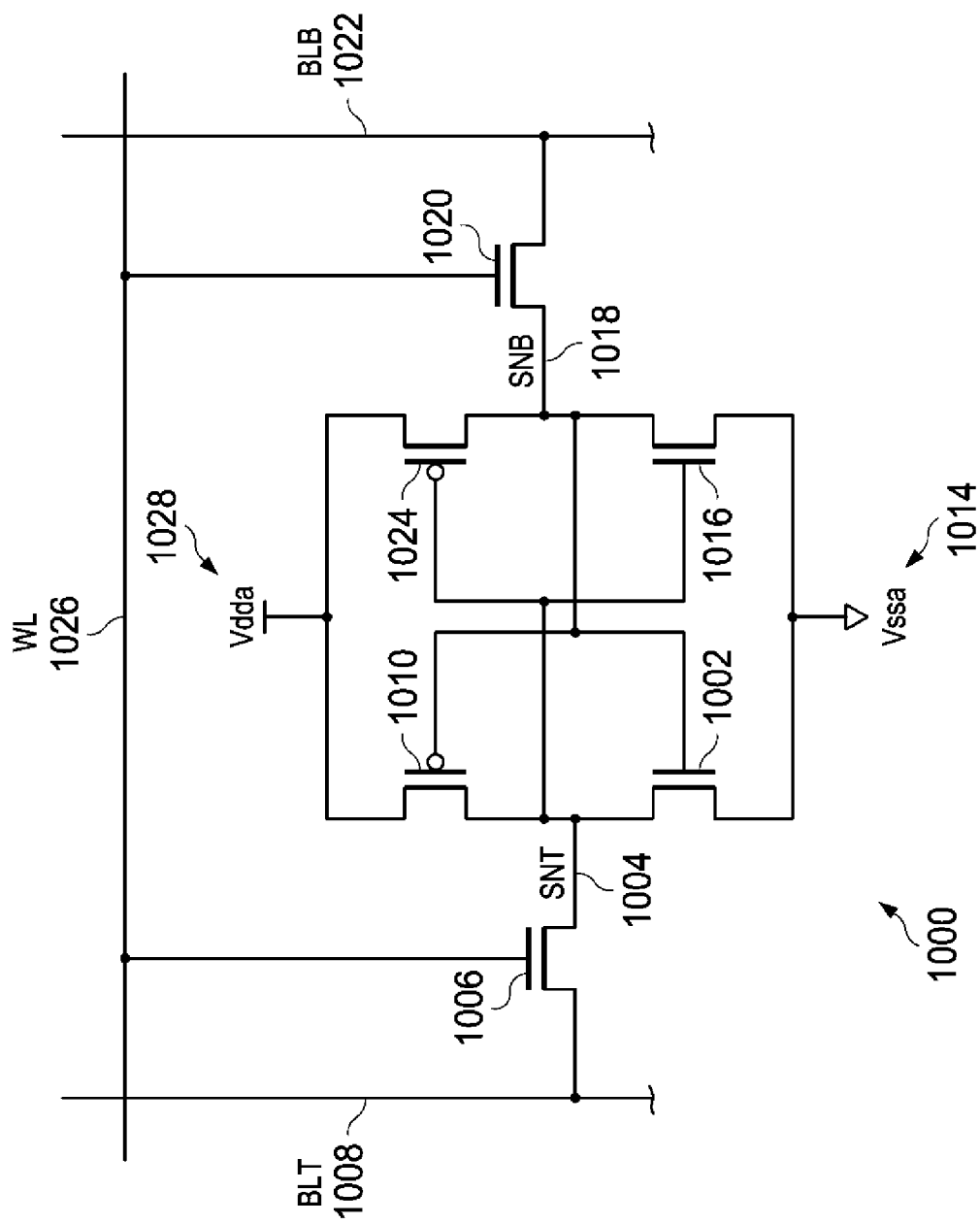
FIG. 1 (Prior Art) is a circuit diagram of an SRAM bit.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different order and/or concurrently with other acts or events. Furthermore, not all illustrated acts or events are required to implement a methodology in accordance with the present invention.

The term "Shmoo plot" refers to a type of graph commonly used to plot the number of SRAM read/write failures that occur at each test voltage measurement point. The term "operational feature Shmoo plot" refers to a Shmoo plot where in addition to the number of failures, the type of operational feature (read, write, or stability) that failed is also specified.

The term "operational feature" refers to operations that an SRAM circuit performs such as writing, reading, or storing data in an SRAM bit. The stability of data stored in an SRAM bit is also an operational feature of an SRAM circuit.

The term "safe-write voltages" refers to a wordline voltage, an array voltage and bitline and bitline-bar voltages that may be used to successfully write data into SRAM bits (1000) in the SRAM array (2028).

The term "safe-read voltages" refers to a wordline voltage, an array voltage and bitline and bitline-bar voltages that may be used to successfully read data from the SRAM bits (1000) in the SRAM array (2028).

The term "operational feature test mode" or "test mode" refers to the mode of operating the SRAM circuit when the read operation, write operation, and data stability is being tested. This mode is different than the normal operating mode in which the SRAM array reads, writes, and stores bits. In the testing mode the wordline voltage, the array voltage, and the bitline and bitline-bar voltages may be individually controlled during the read, write, and stability operations.

The terms "test voltages" refer to a "test wordline voltage", a "test array voltage", and "test bitline and bitline bar voltages" at which the SRAM bits are biased during the test (at different test mode voltage points). During the test mode, the SRAM bit is operated at these test voltages during a portion of the operational feature test to see if the SRAM bit passes or fails the write, read, or stability test. Various test wordline voltage, test array voltage, and test bitline and bitline-bar voltage combinations are measured to span the test space from which a Schmoo plot may then be constructed.

"Operational circuitry" refers to circuitry that is used to read data from or write data to the SRAM bit during the normal operation of the SRAM circuit. It may also be used during the operational feature test mode to read and write data and to test data stability. Additional "test circuitry" may be added to extend the delay time between wordline enable and sense amp enable, to extend the duration of the wordline pulse, to extend the duration of the bitline precharge, or to drive the bitlines during the test mode. Unlike the "operational circuitry" which is used during normal operation of the SRAM circuit, the "test circuitry" may be used when the SRAM circuit has been switched into the test mode. For example, this additional test circuitry may be used during operational feature testing to measure an operational feature of an SRAM bit that is substantially independent of SRAM array architecture and circuit design.

In some instances of integrated circuits containing SRAM arrays, substantially all of the circuits in the integrated circuit are dedicated to the operation of the SRAM array. In these instances, the circuits which provide data to be stored in the SRAM array and the circuits which use data from the SRAM array are located outside the integrated circuit containing the SRAM array. In other instances of integrated circuits containing SRAM bit arrays, such as microprocessors, digital signal processors and wireless telephony controllers, additional circuitry which provides data to be stored in the SRAM array, and circuits which use data from the SRAM array, are also located in the integrated circuit with the SRAM bit array.

FIG. 1 is an illustration of a 6T SRAM bit (1000). The 6T SRAM bit is used for purposes of illustration but it is understood that this invention works equally well with other SRAM bit types. The sources of the PMOS pullup transistors (1010) and (1024) are connected to the array voltage, Vdda (1028). The drain of the left pullup transistor (1010) is connected to the left storage node (1004) that is labeled as storage node true (SNT). The drain of the right pullup transistor (1024) is connected to the right storage node (1018) that is labeled as storage node bar (SNB). The sources of NMOS pulldown transistors (1002 & 1016) are connected to the low voltage array power supply, Vssa (1014), which usually is a voltage close to ground. The drain of the left pulldown transistor (1002) is connected to SNT (1004) and the drain of the right pulldown transistor (1016) is connected to SNB (1018). One side of left NMOS passgate transistor (1006) is connected to SNT (1004), and the other side is connected to the left bit line (1008) that is labeled as bit line true (BLT). One side of the right NMOS passgate transistor (1020) is connected to storage node, SNB (1018) and the other side is connected to the right bit line (1022) that is labeled as bit line bar (BLB). The gates of both passgate transistors (1006 and 1020) are connected to the wordline (1026).

FIG. 2 is a block diagram of a SRAM integrated circuit (2000) containing circuitry to implement testing according to embodiments of this invention. The SRAM integrated circuit (2000) contains an SRAM bit array (2028), a built-in self test circuit block, "BIST", (2004), and a periphery circuit block (2002). The BIST circuit block (2004) includes a bit cell voltage (Vdda) generator circuit (2022), a wordline voltage (WLV) generator circuit (2020), and a BL voltage circuit (2014) for independent control of Vdda, WLV, bitline and bitline-bar voltages during operational feature testing. With independent control of Vdda, WLV, and the bitline voltages during an operational feature test, the type of operational feature that failed may be determined. Also included in the BIST circuit block are a test control circuit (2010) which sends signals to the periphery circuits (2002) and to the other circuits within the BIST circuit (2004) during the test mode, a test pattern generation circuit (2008) which specifies the data value to be written into each SRAM bit during the write operations during test, and a test response evaluation circuit (2006) which determines if the read data value is the same as the written data value (if a fault has occurred). The other circuits shown in the built-in self test circuit block may or may not be included depending upon if the circuitry is to have the capability to measure an operational feature of an SRAM bit with the effects of the SRAM array architecture and circuit design removed. The circuits which enable this capability include a pulse width circuit (2018) which may be used to extend the word line pulse width during a read or write operation, a delay circuit (2016) which may be used to adjust the delay between a wordline pulse and a sense amp enable pulse, an extend precharge circuit (2012) which may be used to adjust the length of the pre-charge enable pulse during a read, and the previously mentioned bit line voltage circuit (2014) which may be used to drive the voltage on the bitlines of the SRAM bit during a write. This is not an inclusive list of circuitry that is in a built-in self test circuit but rather a partial list to help illustrate embodiments of the instant invention.

Included in the periphery control circuit (2002) of FIG. 2 are the wordline drivers (2024) which send wordline select signals to the SRAM bits in the SRAM bit array (2028) through wordlines (2026) and the bitline drivers (2032) which are connected to the SRAM bits in the SRAM bit array (2028) through bitlines (2030). Also included in the periphery control circuit block (2002) and coupled to the bitline drivers (2032) is other circuitry such as pre-charge circuitry (2034) for precharging the bitlines (2030) in an SRAM bit prior to a read or a write, a column multiplexer circuit (2036) for selecting the bitlines (2030) to the targeted SRAM bit (1000), and sense amplifiers (2038) which are connected to the targeted SRAM bit (1000) during a read to sense a voltage differential between the SRAM bitlines (2030). This is not an inclusive list of circuitry that is in the periphery control circuitry but rather a partial list of circuitry to help illustrate embodiments of the instant invention.

Figure 3A:
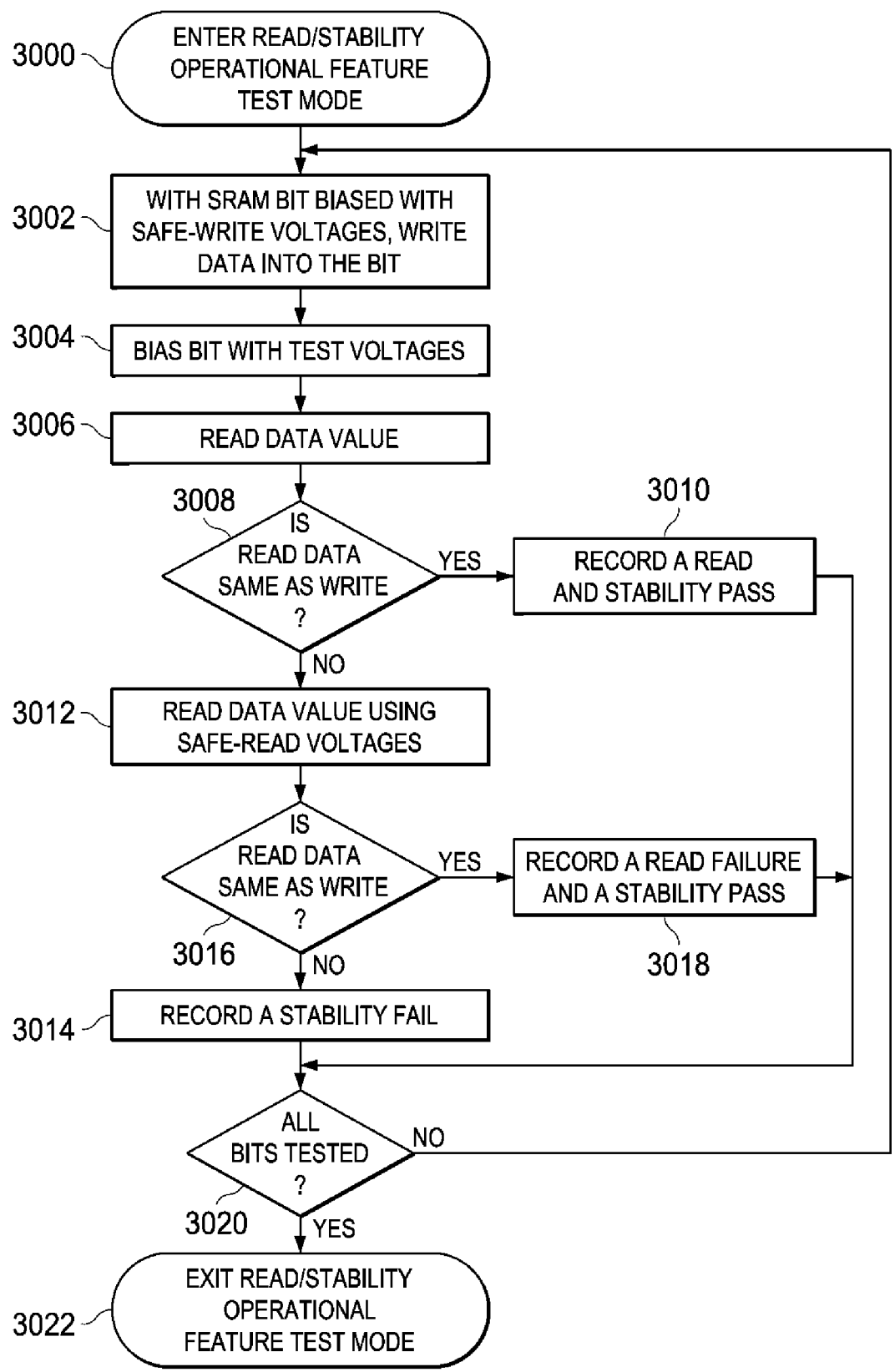
FIGS. 3A and 3B are flow charts of the Read and Stability Test and the Write Test.
Figure 3B:
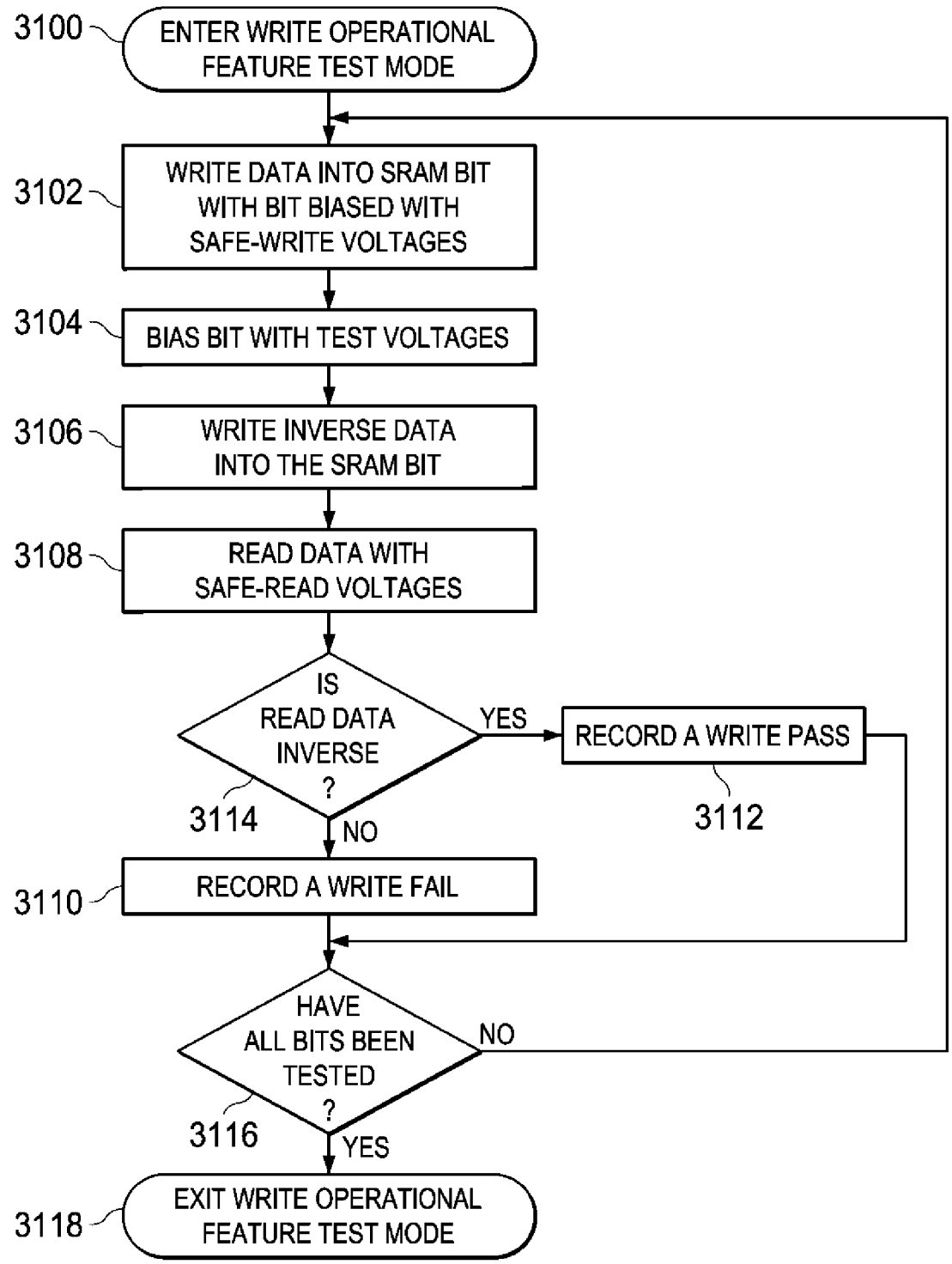

FIG. 3A and FIG. 3B are flowcharts of the read and stability operational feature test operation, and the write operational feature test in accordance with one embodiment. Referring now to FIG. 3A, the read operational feature test begins with step (3000) which sends a signal to the SRAM circuit (2000 in FIG. 2) to switch it into the read/stability operational feature test mode. The next step (3002) is to write data into the SRAM bit with the bit biased with safe-write voltages. These voltages, which consist of a wordline voltage, an array voltage, and bitline and bitline-bar voltages, may be the nominal operating voltages, may be the voltages at the upper or lower limit of the manufacturers specified operating range, or may be some other voltages where the SRAM bit performs a successful write. In step (3004), the SRAM bit (1000) is then biased with test voltages. The data in the SRAM bit (1000) is then read in step (3006) with the bit biased with the test voltages. The read data (3006) is checked (3008) to see if it is equal to the written data (3002). If the read data (3006) is equal to the written data (3002) then a read and stability pass is recorded (3010) and the test proceeds to the next bit if required (3020). However, if the read data (3006) is different than the written data (3002), then a read failure or a stability failure has occurred. To distinguish between the two failure modes the bit is biased with safe-read voltages and the data is again read (3012) and checked (3016) to see if the read data value (3012) is the same as the written data value (3002). If the read data value (3012) with the safe-read voltages is the same as the written data value (3002) then a read failure and a stability pass has occurred and are recorded (3018). In a read failure, the test voltage (3004) was insufficient to read the data correctly, but it did not disturb the data value (i.e. the data is stable.). If, however, the data read with the safe-read voltages (3012) is different than what was written into the bit (3002), a stability failure is recorded (3014). In this instance the read pass or fail cannot be determined due to the stability failure. The data in the SRAM bit was not stable during the read (3006) with the bit biased with test voltages. Steps (3002), (3004), (3006), (3008), (3010), (3012), (3014), (3016), and (3018) constitute an operational feature test for read and for read stability. After recording if the bit passed (3010), or failed read (3018), or failed stability (3014), the program checks to see if all the bits in the array (3020) have been tested and proceeds to test the next bit or exits the test (3022). At each test point, the number of bits in the SRAM array (2000) that failed read (3018) and failed stability (3014) are recorded respectively.

Referring to FIG. 3B, the write operational feature test begins with step (3100) which is to send a signal to the SRAM circuit (2000 in FIG. 2) to switch the circuit into the write operational feature test mode. Next, step (3102) is to bias the SRAM bit (1000) with safe-write voltages and write data (3102) into the SRAM bit (1000). The SRAM bit is then biased with test voltages (3104) and inverse data is written (3106) into the SRAM bit (1000). The data in the SRAM bit (1000) is then read (3108) with the bit biased at safe-read voltages. The read data (3108) is checked (3114) to see if it is equal to the inverse written data (3106). If the read data (3108) is equal to the inverse written data (3106) then the data was written successfully with the bit biased at the test voltages and a write pass is recorded (3112). However, if the read data (3108) is the same as the data written in step (3102) then a write failure has occurred and a write failure is recorded (3110). Steps (3102), (3104), (3106), (3108), (3110), (3112), and (3114) constitute an operational feature test for write. The next step is to check if all bits in the SRAM array (2000) have been tested (3116). If all have been tested, the write test mode is then exited (3118).

A checkerboard or some other pattern may be written into bits (1000) in the SRAM array (2028) and first pass operational feature test performed. Next an inverse of the pattern may be written into the bits (1000) in the SRAM array (2028) and second pass operational feature test performed. The number of bits that failed at a testpoint may then be sum of failures from both the first and second pass operational feature tests with duplicate failures counted as 1 failure.

Each SRAM bit may be tested serially for read/stability and write, before moving on to test the next bit. Another procedure may be to test all SRAM bits in the array for read/stability, for example, before testing all bits for write. It is understood that other testing sequences are possible and that some sequences will be more efficient with respect to test time than others.

The operational feature tests described above include the influence of the SRAM array architecture and circuit design. At times, especially for troubleshooting purposes, it is desirable measure the SRAM bit read, write, and stability with SRAM bit (1000) effectively decoupled from the influence of the SRAM array architecture and circuit design. This facilitates the decision of which approach might be pursued to improve an operational feature. For example, an operational feature may be improved by redesigning the sense amp, by changing the SRAM array architecture, by changing OPC, or by changing the transistor sizes in the SRAM array. This type of testing may be accomplished by adding additional test circuitry. For example, additional test circuitry may be added to control the wordline pulse width, to extend the delay between wordline enable and sense amp enable, to extend the bitline precharge time, or to drive the bitlines during the operational feature testing.

The testing method for determining a read/stability of the SRAM array (2028) with the influence of the layout and read circuitry substantially removed is almost the same as described in FIG. 3A, except that additional test circuitry is added and may be activated to extend the wordline pulse width (2018) and to extend the delay between the wordline pulse enable and the sense amp enable (2016) during the read portion of the operational feature test with the bit biased with test voltages. During the testing cycle the word line pulse width may be extended for a time that is sufficient allow the voltages on SNT and SNB and on BLT and BLB to stabilize, in effect making these voltages independent of bitline design. The delay between word line enable and sense amp enable also may be extended to allow the voltages BLT and BLB to stabilize before the sense amp is enabled. Therefore, the read/stability operational feature that is measured using the additional circuitry is largely independent of the SRAM array layout and circuit design.

The testing method for write of the SRAM array with the effects of the layout and write circuitry substantially removed is almost the same as described in FIG. 3B, except additional circuitry may be added and activated to extend the wordline pulse width (2018) during the write portion of the write operational feature test with the bit biased with the test voltages. The wordline pulse width may be extended sufficiently long so that the voltages on SNT and SNB are independent of the wordline pulse width. Another change that may be desirable is to drive the bitlines (2014) by connecting one bitline to Vdda and the other bitline to Vssa during the test write operation to remove write sensitivity to bitline length. The write operational feature that is determined using the additional circuitry is largely independent of the SRAM array layout and the write circuitry.

Figure 4:
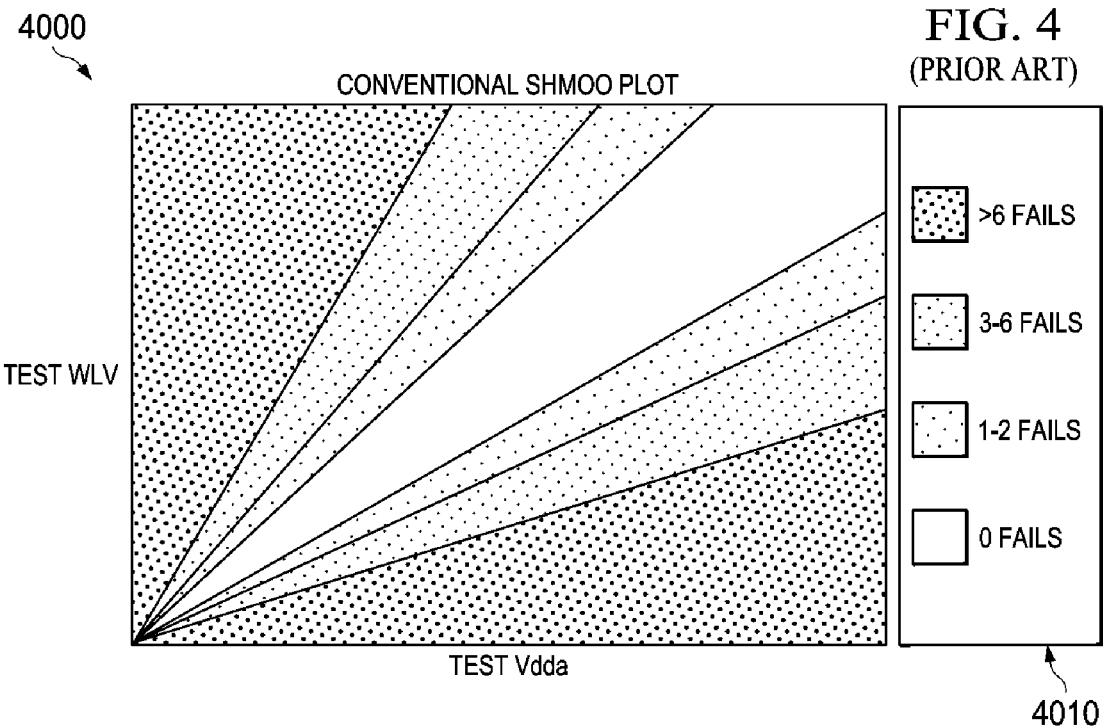
FIG. 4 (Prior Art) is an example of a conventional Shmoo Plot.

Previously, independent control of the wordline voltage, the array voltage, and the bitline and bitline-bar voltages during a portion of an operational feature test was not practiced. Therefore, when a bit failed to write and read successfully at a measurement point, the type of operational feature that failed was not known. Previously prepared Shmoo plots graphed the number of bits that failed at a measurement point, but not the type of failure that occurred. It is common to group the failures into bins (4010) and to use different shading or colors in the areas of the graph to represent the different bins. For example, in the Shmoo plot (4000) shown in FIG. 4, there are four bins (4010): a first bin with zero failed bits, a second bin with one or two failed bits, a third bin with three to six failed bits, and a forth bin with greater than six failed bits. It is understood that many other binning schemes may be chosen. Therefore, in conventional Shmoo plots it is known how many of the SRAM array bits fail at a given measurement point, but the operational feature (read, write, or stability for example) that failed is not known.

Figure 5A:
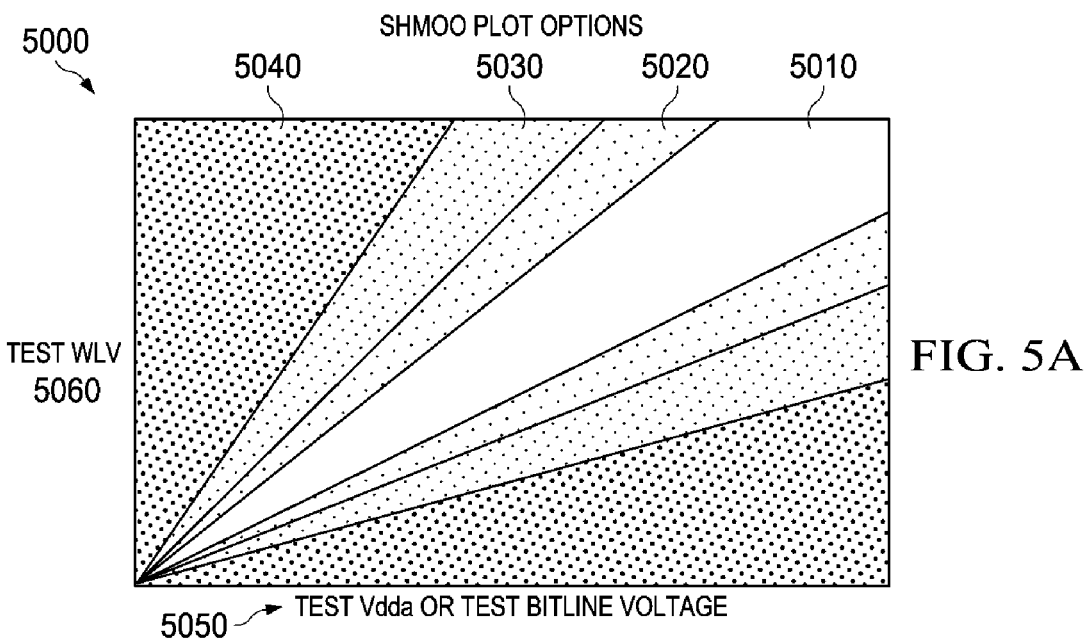

The test methods taught in the following example embodiments determine not only how many SRAM bit failures occur at each test voltage point but also the type of operational feature (read, write, or stability) that failed. Test voltages may be a wordline voltage and an array voltage; a wordline voltage, bitline and bitline-bar voltages; or a wordline voltage, an array voltage, and bitline and bitline bar voltages. Each of these voltages may be independently controlled by the additional test circuitry previously described. This enables Shmoo plots to be constructed where, in addition to the number of failures that occurred at each test voltage point, the type of operational feature that failed may also be specified. It also may be determined which of the independently controlled voltages causes the most operational feature failures at a measurement point. In accordance with one embodiment of the instant invention, a separate 2D Shmoo plot (5000) may be prepared for each operational feature as shown in FIG. 5A. In another embodiment a 2D Shmoo plot (5100) with more than one operational feature may be prepared as shown in FIG. 5B. In FIG. 5A, test WLV (5060) is plotted on the vertical axis of Shmoo plot (5000) and test Vdda or bitline (or bitline-bar, not shown) voltage (5050) is plotted on the horizontal axis. Schmoo plot areas (5010), (5020), (5030), and (5040) are shaded differently to indicate the number of failures that occurred in each area (5070). FIG. 5B is an example of a 2-D Shmoo plot with more than one failure mode. The number of failures for the operational feature with the greatest number of failed bits at a given measurement point is plotted. Shaded Shmoo plot areas (5120), (5130), and (5140) indicate the number of stability or read failures in each area (5190) and Shmoo plot areas (5150), (5160), and (5170) indicate the number of write failures (5180). As is evident from this example other combinations of two or more operational feature types may be plotted on one 2D Shmoo plot. The Shmoo plots in FIG. 5 are shown by way of example and it is understood that different test voltages or combinations of test voltages may be plotted on the axis and various methods may be used to specify the number of failures at a measurement point and the operational feature failure type at a measurement point and still be within the scope of the present embodiment of the instant invention.

Figure 6A:
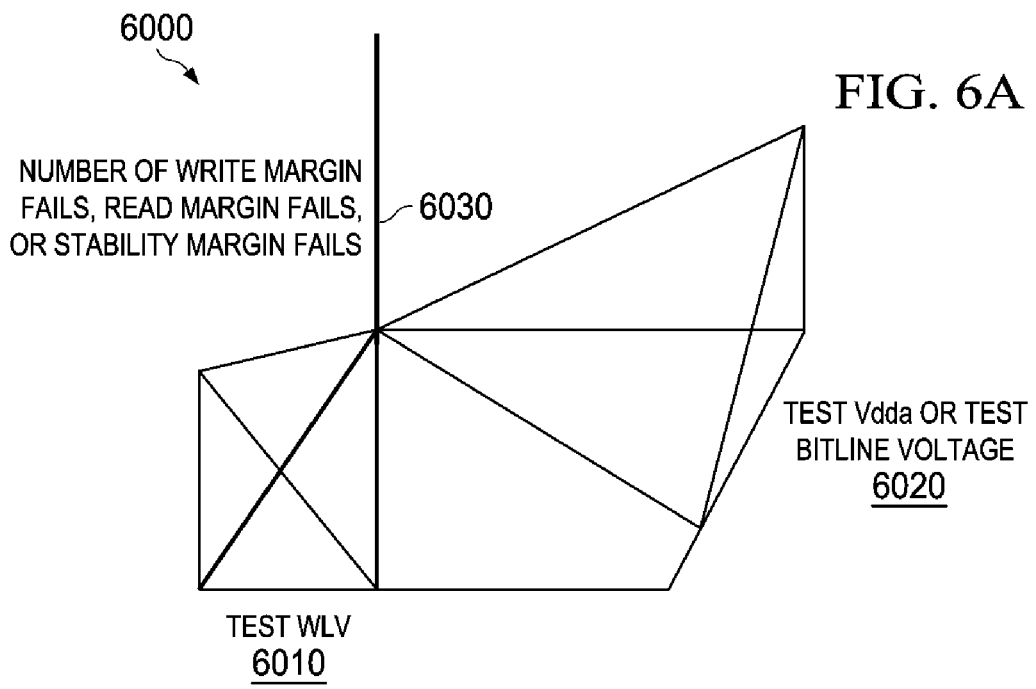
FIGS. 6A and 6B are examples of 3D Shmoo Plots with one failure mode and multiple failure modes respectively.
Figure 6B:
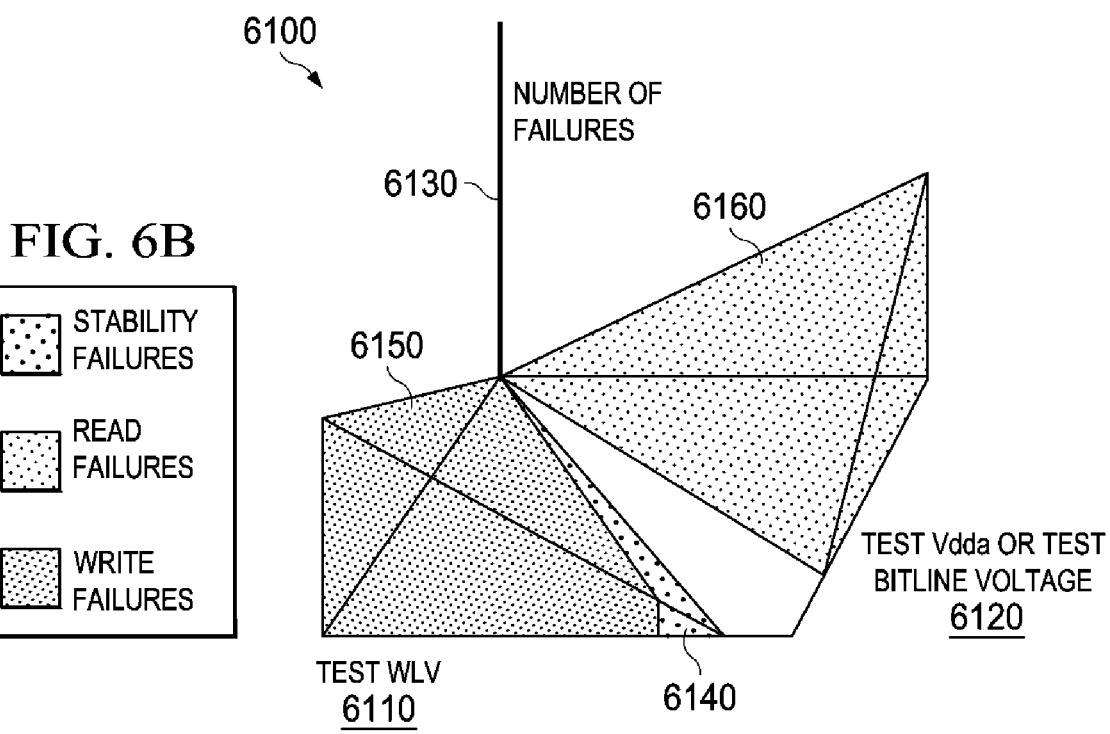

3-D Shmoo plots with single or multiple failure modes may also be prepared as shown in FIGS. 6A and 6B. An example of a 3D Shmoo plot (6000) with the number of failures for a single operational feature is shown in FIG. 6A. Test WLV (6010) is plotted on a first horizontal axis and test Vdda or bitline (or bitline-bar, not shown) voltage (6020) is plotted on a second horizontal axis. The number of operational feature failures (6030) is plotted on the vertical axis.

An example of a 3D Shmoo plot with multiple failure modes specified in the same Shmoo plot is shown in FIG. 6B. Test WLV (6110) is plotted on a first horizontal axis and test Vdda or bitline (or bitline-bar not shown) voltage (6120) is plotted on a second horizontal axis. The maximum number failures (6130) that occurred for write, read, or stability at each measurement point is plotted on the vertical axis. Different shading has been used to specify the type of operational feature failure, read (6140), write (6150), or stability (6160), that occurred in each region of the Shmoo plot. It is understood that this is one example of how a Shmoo plot may be constructed and that other representations which specify both the number of SRAM bit operational feature failures and the type of operational feature that failed may also be constructed. The most commonly plotted operational features are write, read, and stability, but it is understood other operational features may also be plotted using these techniques.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method of constructing an operational feature Shmoo plot for an SRAM array, comprising:
    writing data values into SRAM bits in said SRAM array with said SRAM bits biased with safe-write voltages;
    using operational circuitry to determine a first number of said SRAM bits that fail a first operational feature test at a first measurement point with said SRAM bits biased with a first set of test voltages during a portion of said first operational feature test;
    repeating additional first operational feature tests with additional sets of test voltages at additional measurement points and determining additional first numbers of SRAM bits that fail at each of said additional measurement points; and
    constructing said operational feature Shmoo plot by specifying at graph points corresponding to said first measurement point and said additional measurement points said first number and said additional first numbers of said SRAM bits that fail said first operational feature test.

2. The method of claim 1 wherein said first operational feature test is a write test, wherein said portion is a write operation portion of said write test, and where an inverse of said data values is written into said SRAM bits during said write operation portion of said write test.

3. The method of claim 1 wherein said first operational feature test is a read test, wherein said portion is a read operation portion of said read test, and wherein said data values that are read during a read verify operation following said read operation portion are equal to said data values that were written into said SRAM bit using said safe-write voltages.

4. The method of claim 1 wherein said first operational feature test is a stability test, wherein said portion is a read operation portion of said stability test, and wherein said data values that are read during a read verify operation following said read operation portion are different than said data values that were written into said SRAM bit using said safe-write voltages.

5. The method of claim 1 further comprising:
    determining at least one of a second number and a third number of operational feature failures at said first measurement point and said additional measurement points by performing a least one of a second operational feature test and a third operational feature test;
    determining a max number which is the largest of said first number and said at least one of said second number and said third number; and
    constructing said operational feature Shmoo plot by specifying at each said graph point said max number and also specifying at each said graph point which of said first, second or third operational feature test corresponds to said max number.

6. The method of claim 5 wherein said first operational feature test, said second operational feature test, and said third operational feature test are selected from a group consisting of:
    read test,
    write test, and
    stability test.

7. The method of claim 1 further comprising;
    providing test circuits selected from a group consisting of:
        pulse width test circuitry to extend a wordline pulsewidth,
        drive test circuitry to drive a bitline and a bitline bar,
        precharge test circuitry to extend a precharge time of said bitline and said bitline bar, and
        delay test circuitry to extend a delay between a wordline pulse and a sense amp pulse; and
    activating at least one of said test circuits during said portion of said first operational feature test.

8. The method of claim 7 wherein said first operational feature test is a write test, wherein said portion of said first operational feature test is a write operation portion, and wherein said testing circuits are at least one of said pulse width test circuitry and said drive test circuitry.

9. The method of claim 7 wherein said first operational feature test is a read test, wherein said portion of said first operational feature test is a read operation, and wherein said testing circuits are at least one of said delay test circuitry, said pulse width test circuitry, and said precharge test circuitry.

10. The method of claim 7 wherein said first operational feature test is a stability test, wherein said portion of said first operational test is a read operation portion, and wherein said testing circuits are at least one of said delay test circuitry, said pulse width test circuitry, and said precharge test circuitry.

11. A method of constructing an operational feature Shmoo plot for an SRAM array, comprising:
    writing a first data pattern into said SRAM array;
    determining a first number of first operational feature failures during a first operational feature test using test voltages;
    writing a second data pattern into said SRAM array;
    determining a second number of said first operational feature failures during a first operational feature test using said test voltages;
    determining a maximum number of failures where said maximum number is the larger of said first number and said second number of said first operational feature failures; and
    constructing said operational feature Shmoo plot by specifying at each graph point said maximum number of said first operational feature failures.

12. The method of claim 11 further comprising:
    determining at least one of a first number of second operational feature failures and second number of said second operational feature failures, and a first number of third operational feature failures and a second number of said third operational feature failures at said test voltages by performing a least one of a second operational feature test and a third operational feature test;

determining a max number which is the largest of said first or second number of said first operational feature failures, said first or second number of said second operational feature failures and said first or second number of said third operational feature failures; and constructing said operational feature Shmoo plot by specifying at each said graph point said max number and also specifying at each said graph point which of said first, second or third operational feature test corresponds to said max number.

13. The method of claim 12 wherein said first operational feature test, said second operational feature test, and said third operational feature test are selected from a group consisting of:
   read test,
   write test, and
   stability test.

* * * * *